United States Patent
Nishiguchi

(10) Patent No.: US 9,966,264 B2
(45) Date of Patent: May 8, 2018

(54) SUBSTRATE FOR SEMICONDUCTOR DEVICE AND METHOD OF MANUFACTURING THE SAME

(71) Applicant: Mitsubishi Electric Corporation, Tokyo (JP)

(72) Inventor: Kohei Nishiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 14/922,403

(22) Filed: Oct. 26, 2015

(65) Prior Publication Data

US 2016/0218017 A1    Jul. 28, 2016

(30) Foreign Application Priority Data

Jan. 23, 2015  (JP) .................................. 2015-011445

(51) Int. Cl.
| | |
|---|---|
| *H01L 29/15* | (2006.01) |
| *H01L 21/225* | (2006.01) |
| *H01L 21/02* | (2006.01) |
| *H01L 29/16* | (2006.01) |
| *H01L 29/20* | (2006.01) |

(52) U.S. Cl.
CPC .... *H01L 21/2258* (2013.01); *H01L 21/02167* (2013.01); *H01L 21/02175* (2013.01); *H01L 21/02181* (2013.01); *H01L 21/2251* (2013.01); *H01L 29/1608* (2013.01); *H01L 29/2003* (2013.01)

(58) Field of Classification Search
CPC ...................... H01L 21/2258; H01L 21/02167
USPC .......................................................... 257/77
See application file for complete search history.

(56) References Cited

U.S. PATENT DOCUMENTS

| | | | | |
|---|---|---|---|---|
| 4,923,823 | A | * | 5/1990 | Kohno .............. H01L 29/66878 257/280 |
| 5,389,799 | A | * | 2/1995 | Uemoto .............. H01L 29/0847 257/472 |
| 6,346,465 | B1 | * | 2/2002 | Miura ............... H01L 21/28518 257/E21.163 |

(Continued)

FOREIGN PATENT DOCUMENTS

| | | |
|---|---|---|
| CN | 104037075 A | 9/2014 |
| JP | H06-317787 A | 11/1994 |

(Continued)

OTHER PUBLICATIONS

An Office Action issued by the French Patent Office dated Oct. 17, 2017, which corresponds to French Patent Application No. 1562041 and is related to U.S. Appl. No. 14/922,403; with partial English translation.

(Continued)

*Primary Examiner* — Jami M Valentine
(74) *Attorney, Agent, or Firm* — Studebaker & Brackett PC

(57) ABSTRACT

A substrate for semiconductor device includes a substrate, a reaction layer provided on a back surface of the substrate, a transmission preventing metal having a transmittance with respect to red light or infrared light lower than that of the substrate and a material of the substrate being mixed in the reaction layer, and a metal thin film layer formed on a back surface of the reaction layer and formed of the same material as the transmission preventing metal.

5 Claims, 3 Drawing Sheets

(56) References Cited

U.S. PATENT DOCUMENTS

| | | | | |
|---|---|---|---|---|
| 6,577,005 B1* | 6/2003 | Tanaka | H01L 21/28518 | |
| | | | 257/741 | |
| 2004/0112278 A1* | 6/2004 | Yoshida | C30B 29/403 | |
| | | | 117/30 | |
| 2006/0246304 A1* | 11/2006 | Ishihara | B23K 35/007 | |
| | | | 428/446 | |
| 2007/0031633 A1* | 2/2007 | Satoh | C23C 14/0036 | |
| | | | 428/64.4 | |
| 2010/0133093 A1* | 6/2010 | MacKie | C23C 14/165 | |
| | | | 204/192.25 | |
| 2010/0203239 A1* | 8/2010 | Finley | C03C 17/36 | |
| | | | 427/160 | |
| 2011/0211354 A1* | 9/2011 | Kim | H01L 33/20 | |
| | | | 362/311.01 | |
| 2011/0241022 A1 | 10/2011 | Masuda | | |
| 2013/0048488 A1* | 2/2013 | Shufflebotham | H01L 31/18 | |
| | | | 204/192.1 | |
| 2015/0168222 A1* | 6/2015 | Noda | H01L 37/02 | |
| | | | 250/338.3 | |
| 2015/0206967 A1* | 7/2015 | Hayashi | H01L 27/0255 | |
| | | | 257/77 | |
| 2016/0209273 A1* | 7/2016 | Kubo | G01J 5/046 | |
| 2017/0088954 A1* | 3/2017 | Yokoyama | C23C 8/10 | |

FOREIGN PATENT DOCUMENTS

| | | | | |
|---|---|---|---|---|
| JP | 2007149983 A * | 6/2007 | | H01L 33/00 |
| JP | 2010-141124 A | 6/2010 | | |

OTHER PUBLICATIONS

CN Office Action dated Dec. 28, 2017, from corresponding CN Appl. No. 201610045414.5, with English translation, 13 pp.

\* cited by examiner

SUBSTRATE FOR SEMICONDUCTOR DEVICE AND METHOD OF MANUFACTURING THE SAME

BACKGROUND OF THE INVENTION

Field of the Invention

The present invention relates to, for example, a substrate for use in making a semiconductor device and to a method of manufacturing the substrate.

Background Art

Various kinds of processing are performed on a semiconductor substrate to make on the substrate a circuit having components such as transistors, resistors and capacitors. For example, a metal thin film or an insulating film is formed on a substrate by a semiconductor manufacturing apparatus and a resist is patterned by an exposure apparatus.

In a wafer process in which various kinds of processing are performed on a substrate, the presence/absence of the substrate is detected with a substrate recognition sensor in a semiconductor manufacturing apparatus. For detection of the presence/absence of an Si or GaAs substrate, the property of the substrate to absorb (or reflect) red light or infrared light is utilized. More specifically, the absence of the substrate is recognized when red light or infrared light is incident on the sensor. Also, the presence of the substrate is recognized when red light or infrared light is absorbed by the substrate and is not incident on the sensor.

In recent years, a compound semiconductor substrate such as an SiC or GaN substrate having a bandgap wider than that of Si has been put to use in a power device or a radiofrequency device in some cases. Since SiC or GaN is transparent to red light or infrared light, the presence/absence of the substrate cannot be detected by means of red light or infrared light.

Japanese Patent Laid-Open No. 2010-141124 discloses an arrangement in which a total reflecting surface provided on an end portion of a substrate reflects red light or the like.

A semiconductor manufacturing apparatus used to process an Si or GaAs substrate or the like detects the presence/absence of the substrate by means of red light or infrared light. If a new detection system is constructed to detect a substrate transparent to red light or infrared light, the manufacturing cost is increased. It is, therefore, preferable to process a substrate transparent to red light or infrared light with an existing semiconductor manufacturing apparatus capable of detecting the presence/absence of a substrate transparent to red light or infrared light. The technique disclosed in Japanese Patent Laid-Open No. 2010-141124, however, uses a total reflecting surface provided on an end portion of a substrate and therefore has a problem of being incapable of detecting the presence/absence of the substrate at a central portion of the substrate.

A method of enabling detection of a substrate transparent to red light or infrared light by forming a metal thin film layer such as Cr, W or Al having a low transmittance with respect to red light or infrared light on the back surface of the substrate is conceivable. However, there is a possibility of the metal thin film layer being separated or etched in a process in which treatments such as heat treatment, dry etching, wet etching and treatment with a chemical solution are repeatedly performed.

SUMMARY OF THE INVENTION

The present invention has been achieved to solve the above-described problems, and an object of the present invention is to provide a substrate for semiconductor device capable of being processed without any detrimental effect by a semiconductor manufacturing apparatus using red light or infrared light for detection of the presence/absence of a substrate, and a method of manufacturing the substrate for semiconductor device.

The features and advantages of the present invention may be summarized as follows.

According to one aspect of the present invention, a substrate for semiconductor device includes a substrate, a reaction layer provided on a back surface of the substrate, a transmission preventing metal having a transmittance with respect to red light or infrared light lower than that of the substrate and a material of the substrate being mixed in the reaction layer, and a metal thin film layer formed on a back surface of the reaction layer and formed of the same material as the transmission preventing metal.

According to another aspect of the present invention, a method of manufacturing a substrate for semiconductor device includes a step of forming on a back surface of a substrate a metal thin film layer having a transmittance with respect to red light or infrared light lower than that of the substrate, and a reaction step of diffusing a material of the metal thin film layer into the substrate by heating the substrate and the metal thin film layer so that a reaction layer is formed in which a material of the substrate and the material of the metal thin film layer are mixed with each other.

Other and further objects, features and advantages of the invention will appear more fully from the following description.

DETAILED DESCRIPTION OF THE PREFERRED EMBODIMENTS

Figure 1:
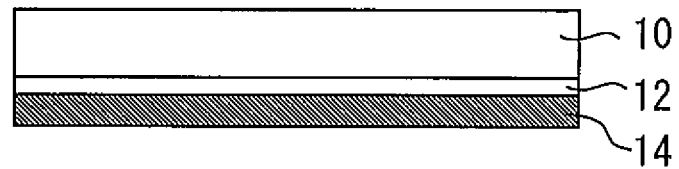
FIG. 1 is a front view of a substrate for semiconductor device according to a first embodiment.

A substrate for semiconductor device and a method of manufacturing the same according to an embodiment of the present invention will be described with reference to the drawings. Components identical or corresponding to each other are indicated by the same reference characters and repeated description of them is omitted in some cases.

First Embodiment

FIG. 1 is a front view of a substrate for semiconductor device according to a first embodiment of the present invention. The substrate for semiconductor device according to the first embodiment includes a substrate 10. The substrate 10 is formed of a material such as SiC or GaN transparent to red light or infrared light. A reaction layer 12 is provided on a back surface of the substrate 10. The reaction layer 12 is a layer in which a transmission preventing metal having a transmittance with respect to red light or infrared light lower than that of the substrate 10 and the material of the substrate 10 are mixed with each other.

A metal thin film layer 14 is formed on a back surface of the reaction layer 12. The metal thin film layer 14 is formed of the same material as the aforementioned transmission preventing metal. The metal thin film layer 14 is formed, for example, of an alloy containing Ni or of Ni. The alloy containing Ni is, for example, NiCr, NiFe, NiMo, NiTi or NiW.

A method of manufacturing the substrate for semiconductor device according to the first embodiment of the present invention will be described. The metal thin film layer 14 having a transmittance with respect to red light or infrared light lower than that of the substrate 10 is first formed on the back surface of the substrate 10. The metal thin film layer 14 is formed, for example, by vapor deposition or sputtering.

Subsequently, a reaction step is executed. In the reaction step, the substrate 10 and the metal thin film layer 14 are heated to diffuse the material of the metal thin film layer 14 into the substrate 10, thereby forming the reaction layer 12 in which the material of the substrate 10 and the material of the metal thin film layer 14 are mixed with each other. It is preferable to heat the substrate 10 and the metal thin film layer 14 to a temperature equal to or higher than 850° C. by rapid thermal annealing or the like.

Figure 2:
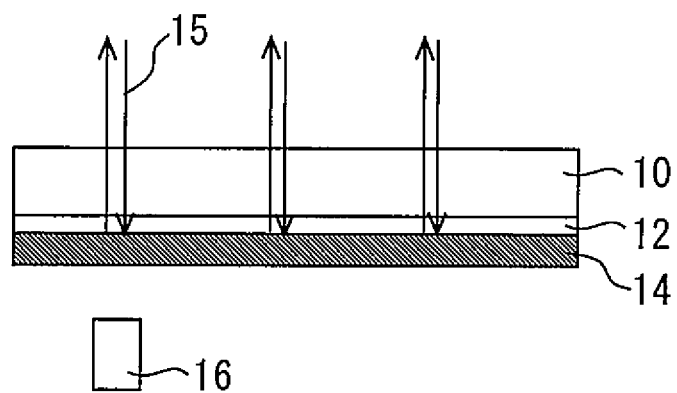
FIG. 2 is a diagram showing a method of detecting the presence/absence of the substrate.

On the substrate thus completed, treatments such as heat treatment, dry etching, wet etching and treatment with a chemical solution for forming semiconductor elements on the substrate are repeatedly performed. When handling (transport) or alignment of the substrate for example is performed, a place where the substrate is present or a place where the substrate is absent is irradiated with red light or infrared light to detect the presence/absence of the substrate. FIG. 2 is a diagram showing a method of detecting the presence/absence of the substrate. Rays 15 which are red light or infrared light are incident on the substrate and are reflected by the metal thin film layer 14. In this case, rays 15 are not incident on a sensor 16 and it is, therefore, recognized that the substrate is present in the semiconductor manufacturing apparatus. On the other hand, when rays 15 are incident on the sensor 16, it is recognized that the substrate is absent in the semiconductor manufacturing apparatus.

In the case where only forming of a metal thin film layer (Cr, W or Al for example) by vapor deposition, sputtering or chemical vapor deposition is performed, the force of adhesion of the metal thin film layer to the substrate is low. If the metal thin film layer is separated or etched in a wafer process, it becomes impossible to detect the presence/absence of the substrate and a substrate recognition error occurs. To prevent this, in the first embodiment of the present invention, a component of the metal thin film layer 14 is diffused into the substrate 10 to form the reaction layer 12. The reaction layer 12 increases the force of adhesion between the substrate 10 and the metal thin film layer 14. Separation and etching of the metal thin film layer 14 can be prevented with the reaction layer 12. Consequently, the substrate can be processed without any detrimental effect by a semiconductor manufacturing apparatus using red light or infrared light for detection of the presence/absence of the substrate.

Since the substrate for semiconductor device according to the first embodiment of the present invention has the reaction layer 12 and the metal thin film layer 14 formed on the entire back surface of the substrate 10, red light or infrared light may be made incident either on an end portion or on a central portion of the substrate.

The substrate for semiconductor device according to the first embodiment of the present invention is characterized by preventing separation or the like of metal thin film layer 14 with the reaction layer 12. Various modifications can be made without losing this feature. For example, a (transparent) substrate or semiconductor layer may be formed on the substrate 10. Substrates for semiconductor device and methods of manufacturing the same according to embodiments described below have a number of commonalities with the first embodiment and will therefore be described mainly with respect to points of difference from the first embodiment.

Second Embodiment

Figure 3:
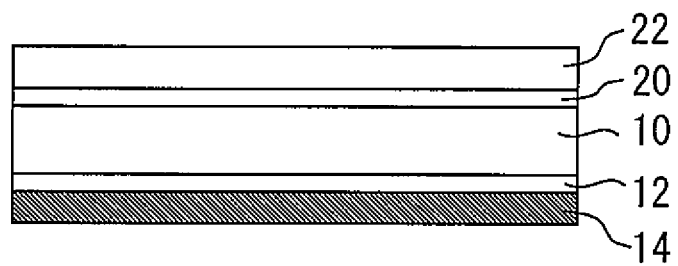
FIG. 3 is a front view of a substrate for semiconductor device according to the second embodiment.

FIG. 3 is a front view of a substrate for semiconductor device according to the second embodiment of the present invention. This substrate includes a semiconductor layer 20 formed on the front surface of the substrate 10 and an insulating film 22 formed on the front surface of the semiconductor layer 20. The insulating film 22 is, for example, an SiN film or an SiO film.

A method of manufacturing the substrate for semiconductor device according to the second embodiment will be described. Before the reaction step, the semiconductor layer 20 is formed on the front surface of the substrate 10 and the insulating film 22 is formed on the front surface of the semiconductor layer 20. The insulating film 22 is formed by chemical vapor deposition or sputtering. The reaction step is thereafter executed. Because the substrate is heated to a higher temperature in the reaction step, there is an apprehension of denaturation of the semiconductor layer 20. Denaturation of the semiconductor layer 20, however, can be prevented with the insulating film 22. Thus, even in a case where the semiconductor layer 20 is formed on the substrate 10 before the reaction step, denaturation of the semiconductor layer 20 can be prevented by providing the insulating film 22.

Third Embodiment

Figure 4:
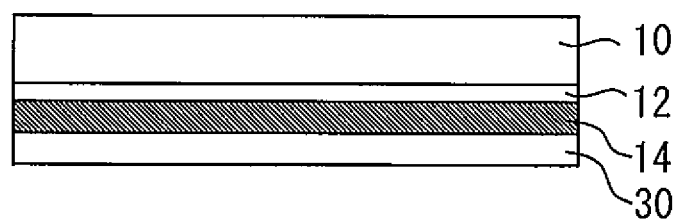
FIG. 4 is a front view of a substrate for semiconductor device according to the third embodiment.

FIG. 4 is a front view of a substrate for semiconductor device according to the third embodiment of the present invention. This substrate includes an etching protective film 30 on the back surface of the metal thin film layer 14. The etching protective film 30 is formed of SiC, $HfO_2$, $ZnO_2$ or a precious metal. The precious metal is, for example, Au, Pt or Pd. The etching protective film 30 is hard to etch in any etching step in a wafer process.

The etching protective film 30 is formed on the back surface of the metal thin film layer 14 by vacuum deposition, sputtering, chemical vapor deposition or atomic layer deposition (ALD). The protective film 30 may be formed either before or after the reaction step.

Etching is performed a number of times in a wafer process and there is a possibility of the metal thin film layer 14 being reduced by the etching. In the third embodiment of the present invention, therefore, the etching protective film 30 is provided on the back surface of the metal thin film layer 14. The reduction of the metal thin film layer 14 by the etching can be limited with the etching protective film 30.

Fourth Embodiment

Figure 5:
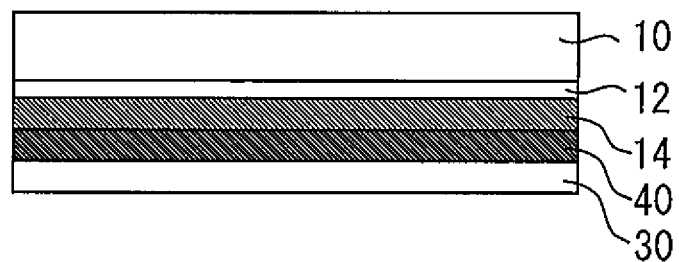
FIG. 5 is a front view of a substrate for semiconductor device according to the fourth embodiment.

FIG. 5 is a front view of a substrate for semiconductor device according to the fourth embodiment of the present invention. An additional metal thin film layer 40 is formed on the back surface of the metal thin film layer 14. The additional metal thin film layer 40 is formed, for example, of W, Cr or Al. The additional metal thin film layer 40 formed of W, Cr or Al has a transmittance with respect to red light or infrared light lower than that of the metal thin film layer 14 formed of an alloy containing Ni or of Ni. The etching protective film 30 is formed on the back surface of the additional metal thin film layer 40. The etching protective film 30 is formed of SiC, $HfO_2$, $ZnO_2$ or a precious metal.

A method of manufacturing the substrate for semiconductor device according to the fourth embodiment of the present invention includes a step of forming the additional metal thin film layer 40 of W, Cr or Al on the back surface of the metal thin film layer 14, and a step of forming the etching protective film 30 of SiC, $HfO_2$, $ZnO_2$ or a precious metal on the back surface of the additional metal thin film layer 40. These steps may be performed either before or after the reaction step.

Since the additional metal thin film layer 40 has a transmittance with respect to red light or infrared light lower than that of the metal thin film layer 14, the accuracy of detection of the presence/absence of the substrate can be improved. The etching protective film 30 may be removed. A suitable combination of the features of the substrates for semiconductor device and the methods of manufacturing the same according to the embodiments described above may be made and used as desired.

According to the present invention, separation and etching of the metal thin film layer can be inhibited by diffusing a component of the metal thin film layer into the substrate.

Obviously many modifications and variations of the present invention are possible in the light of the above teachings. It is therefore to be understood that within the scope of the appended claims the invention may be practiced otherwise than as specifically described.

What is claimed is:

1. A semiconductor substrate for semiconductor device comprising:
   a semiconductor substrate;
   a reaction layer provided on a back surface of the semiconductor substrate, a transmission preventing metal having a transmittance with respect to red light or infrared light lower than that of the semiconductor substrate and a material of the semiconductor substrate being mixed in the reaction layer;
   a metal thin film layer formed on a back surface of the reaction layer and formed of the same material as the transmission preventing metal; and
   an etching protective film provided on a back surface of the metal thin film layer, the etching protective film being formed of SiC, $HfO_2$, $ZnO_2$ or a precious metal.

2. A semiconductor substrate for semiconductor device comprising:
   a semiconductor substrate;
   a reaction layer provided on a back surface of the semiconductor substrate, a transmission preventing metal having a transmittance with respect to red light or infrared light lower than that of the semiconductor substrate and a material of the semiconductor substrate being mixed in the reaction layer;
   a metal thin film layer formed on a back surface of the reaction layer and formed of the same material as the transmission preventing metal; and
   an additional metal thin film layer provided on a back surface of the metal thin film layer, the additional metal thin film layer being formed of W, Cr or Al.

3. The semiconductor substrate for semiconductor device according to claim 2, further comprising an etching protective film provided on a back surface of the additional metal thin film layer, the etching protective film being formed of SiC, $HfO_2$, $ZnO_2$ or a precious metal.

4. The semiconductor substrate for semiconductor device according to claim 1, wherein the metal thin film layer is formed of an alloy containing Ni or of Ni.

5. The semiconductor substrate for semiconductor device according to claim 1, wherein the semiconductor substrate is formed of SiC or GaN.

* * * * *